(12) United States Patent
Ballinger et al.

(10) Patent No.: US 8,999,822 B2
(45) Date of Patent: Apr. 7, 2015

(54) METHOD FOR CREATING SEMICONDUCTOR JUNCTIONS WITH REDUCED CONTACT RESISTANCE

(71) Applicant: Evident Technologies, Troy, NY (US)

(72) Inventors: Clinton T. Ballinger, Burnt Hills, NY (US); Susanthri Perera, Cohoes, NY (US); Adam Z. Peng, Schenectady, NY (US)

(73) Assignee: Evident Technologies, Troy, NY (US)

( * ) Notice: Subject to any disclaimer, the term of this patent is extended or adjusted under 35 U.S.C. 154(b) by 0 days.

(21) Appl. No.: 14/531,360

(22) Filed: Nov. 3, 2014

(65) Prior Publication Data

US 2015/0056789 A1 Feb. 26, 2015

Related U.S. Application Data

(62) Division of application No. 13/644,812, filed on Oct. 4, 2012, now Pat. No. 8,895,411.

(60) Provisional application No. 61/544,436, filed on Oct. 25, 2011.

(51) Int. Cl.
*H01L 21/20* (2006.01)
*H01L 21/18* (2006.01)
*H01L 21/28* (2006.01)
*H01L 21/324* (2006.01)

(52) U.S. Cl.
CPC .............. *H01L 21/187* (2013.01); *H01L 21/28* (2013.01); *H01L 21/324* (2013.01)

(58) Field of Classification Search
USPC ......................... 438/340, 343, 356, 378, 472; 257/E21.184, E21.325
See application file for complete search history.

(56) References Cited

U.S. PATENT DOCUMENTS 7,807,917 B2 * 10/2010 Atanackovic .............. 136/236.1

* cited by examiner

*Primary Examiner* — Cheung Lee
(74) *Attorney, Agent, or Firm* — Hoffman Warnick LLC

(57) ABSTRACT

Embodiments of the invention relate generally to creating semiconductor junctions with reduced contact resistance. In one embodiment, the invention provides a method of forming a composition of material, the method comprising: providing at least two populations of semiconducting materials; layering the at least two populations of semiconducting materials to form at least two layers; and consolidating the at least two populations of semiconducting materials, wherein the consolidating creates an electrical connection between the at least two layers.

8 Claims, 1 Drawing Sheet

METHOD FOR CREATING SEMICONDUCTOR JUNCTIONS WITH REDUCED CONTACT RESISTANCE

CROSS-REFERENCE TO RELATED APPLICATIONS

This application claims the benefit of co-pending U.S. application Ser. No. 13/644,812, filed 4 Oct. 2012, which claims the benefit of U.S. Provisional Application Ser. No. 61/544,436, filed 25 Oct. 2011, which are hereby incorporated by reference herein.

FIELD OF THE INVENTION

Embodiments of the present invention relate generally to methods of creating junctions between two semiconductor regions or between a semiconductor and a conductor, where a strong electrical contact is desired.

BACKGROUND OF THE INVENTION

Semiconductor materials have been used in a broad range of applications, including logic gates, sensors, solar cells, and many other applications. These materials form the backbone of modern electronic applications. Many of these applications capitalize on the semiconducting nature of the material to perform a function that involves flowing electrons.

Typically, electron flow in and out of the active semiconductor region involves a semiconductor-metal interface. This semiconductor-metal interface is often characterized by a contact resistance, which is notoriously difficult to reduce. This contact resistance of the interface degrades the overall efficiencies of the device due to poorly matched or connected electrical contacts between the metal and the semiconductor. It is often difficult to have metal adhere to certain semiconductor materials and there are often impurities, defects, etc. that are between the metal contact and the underlying semiconductor. Furthermore, additional layers are often required to impede the diffusion of materials from the metal region to the semiconductor region. Semiconductor materials are typically in the form of a crystal lattice structure, through which it is often easy to diffuse metallic atoms. Hence a layer is typically used to separate the metal contact from the semiconductor region so as not to dope the semiconductor with metallic ions via the diffusion process.

SUMMARY OF THE INVENTION

A first aspect of the present invention includes a method of forming a composition of material, the method comprising: providing at least two populations of semiconducting materials; layering the at least two populations of semiconducting materials to form at least two layers; and consolidating the at least two populations of semiconducting materials, wherein the consolidating creates an electrical connection between the at least two layers.

A second aspect of the present invention includes a method of forming a composition of material, the method comprising: providing a population of a semiconducting material and a population of a metal material; layering the population of the semiconducting material and the population of the metal material; and consolidating the layered materials to form at least two layers, wherein the consolidating creates an electrical connection between at least two layers.

A third aspect of the present invention includes a consolidated material, the consolidated material comprising: at least two populations of semiconducting materials, wherein the at least two populations of semiconducting materials are arranged in at least two alternating layers.

A fourth aspect of the present invention includes a consolidated material, the consolidated material comprising: a population of a semiconducting material and a population of a metal material, wherein the population of the semiconducting material and the population of the metal material are arranged in at least two alternating layers.

It is noted that the drawings of the invention are not to scale. The drawings are intended to depict only typical aspects of the invention, and therefore should not be considered as limiting the scope of the invention.

DETAILED DESCRIPTION OF THE INVENTION

Embodiments of the present invention can allow for a multi-layer approach to the metallization issue. For instance, a buffer region can be placed on top of the active semiconductor region that bridges the gap between the metal and the semiconductor. This can be accomplished by either doping the semiconductor region or inserting a monolayer between layers. The doping material or monolayer may be made up of materials such as Tin, Aluminum, other conductors, or semiconductors in order to make the contact stronger with the metallization material.

Many times, powders are consolidated into monolithic semiconductor materials and are later incorporated into a device. Thermoelectric elements that are produced by consolidating fine powder semiconductor materials into a solid, mechanically stable material with appropriate properties are one example of such a consolidated, monolithic material. The consolidation process typically involves heat and pressure to consolidate the powder. After the semiconductor is consolidated, it is processed and used in an application that typically requires at least one metal contact to be applied to the semiconductor region.

Embodiments of the invention can include a method for making a P/N junction of two semiconductor materials via the consolidation step without requiring any further processing. One of the inherent obstacles in many semiconductor applications is that the contact resistance between two regions is too high and leads to poor performance. Typically, a semiconductor material is manufactured and then connected to another semiconductor via a conductive material. One typical example includes portions of a device, such as a P/N junction within a device. Such junctions are a part of many electronic applications, and are typically derived from two dissimilar semiconductor materials. Contact resistance between these materials is a loss mechanism and can degrade the overall system efficiency. The consolidation methods outlined herein can also be utilized to solidify two dissimilar semiconductor materials directly without a need for contacts through post processing, which is typically required in previous attempts. In one embodiment, consolidating methods can be utilized for two or more different types of semiconductor powders, wherein the powders may be of different compositions, sizes, or some combination thereof. After consolidation methods according to certain embodiments, the electrical connection between the two or more materials may be strong enough to not require a contact region, thus eliminating the contact resistance of the consolidated material.

Figure 1:
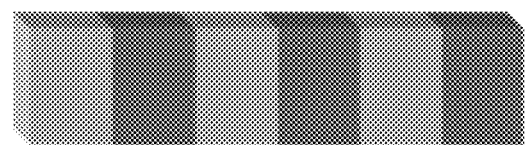
FIG. 1 illustrates a consolidated material with alternating layers according to some embodiments.

FIG. 1 illustrates an example of a consolidated material according to some embodiments. In this example, a consolidated material has been produced with alternating layers of P and N type semiconductor materials. The P and N type semiconductor materials may be semiconductors such as Si, Ge, SiC, SiGe, AlSb, AlAs, AlP, BN, BAs, BiSbTe, BiTe, GaSB, GaAs, GaN, GaP, InSb, InAs, InN, AlGaAs, InGaAs, InGaP, AlGaInP, AlGaAsP, CdSe, CdS, CdTe, PbSe, PbS, PbTe, ZnS, ZnSe, ZnTe, HgZnTe, HgZnSe, SnS, SnTe, PbSnTe, CuO, BiO, and SnO. This list is not exhaustive, and other materials may be used, as will be recognized by one skilled in the art. These materials may act as either P or N type semiconductors depending on dopant level. Typical dopants can include metals, semimetals, semiconductors, or other materials that can be added to a semiconductor to alter the main charge carrier making it either a P or an N type semiconductor. The P and N type layers may have started as powders, nanomaterials such as quantum dots, or other semiconductors. They can then be consolidated together in order to form a solid semiconductor with alternating P and N layers with no need for contact layers to be inserted after the consolidation. In another embodiment, other layers, such as insulators, conductors, semimetals, or semiconductors, may be added between the P and N type semiconductors, depending on the end application. These additional layers could be added to the layering process of the material prior to consolidation of the materials. As such, the layers would be consolidated into the end material, such that no contact layers are necessary.

Figure 2:
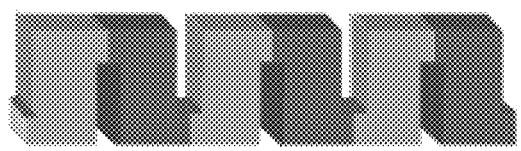
FIG. 2 illustrates a monolithic P and N consolidated material which has been further processed to include pillars.

FIG. 2 illustrates a similar P and N consolidated material which has been further processed. This material has undergone post-processing to create pillars within the consolidated material, but still without the need to add contacts in the post-processing steps. Methods of post-processing to form pillars are known in the art, and any now known or later developed methods may be utilized. This embodiment can be useful for many applications. For instance, the pillar design may be useful in thermoelectric applications, as it eliminates the need to create a contact region between the pillars since the pillars are electrically connected to each other via the consolidation step as described above. Furthermore, pillars may be directly formed by consolidation without a further post-processing step, for instance by consolidating a material already shaped into pillars.

Figure 3:
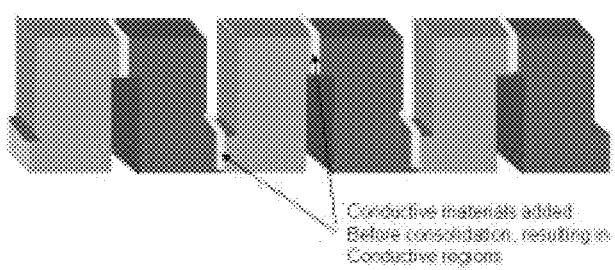
FIG. 3 illustrates an embodiment including conductive materials between the P and N type semiconductors of a consolidated material.

In another embodiment, conductive materials could be added between the dissimilar semiconductor regions in order to enhance the electrical conductivity between the layers. In addition to enhancing the electrical properties, the addition of conductive materials can provide a pathway for a more even heating of the P/N junction in thermoelectric applications. In these embodiments, the conductive material can be added to the starting materials of powders, nanomaterials, or monolithic semiconductors, and inserted between some or all of the included layers. According to such an embodiment, the conductive material is subjected to the same consolidation of the layers and can thus integrate into the end material without causing the conductive resistance that occurs due to adding contacts after the processing steps. FIG. 3 illustrates an embodiment including conductive materials between the P and N type semiconductors.

In other embodiments, other materials may be added between the dissimilar semiconductors. For example, a junction can be made with an insulator material between some or all of the layers. In this embodiment, the interface can help degrade thermal and electrical conductivity between layers. In another embodiment, a high band gap semiconductor material may be utilized in a junction between layers of the end material. This high band gap semiconductor can act as an energy filter for transporting electrons between the layers, enhancing the electrical properties. This could be particularly useful in thermoelectric applications where the desire is to preferentially transport high energy electrons across the P/N junction.

In another embodiment, a population of semiconducting material and a population of a metal material may be layered, as described above regarding two populations of semiconductor materials. These alternating layers of semiconductor and metal can be consolidated by any of the above-described methods, creating an electrical connection between the layered material. This could be useful in thermoelectric applications, for example, in order to have a metal layer between the P and N layers as it could allow for more even temperature distribution throughout the junction and may enhance the electrical conductivity.

Although described as separate embodiments, it should be understood that any combination of above elements may be used together, separately, or in any combinable way. Each of the embodiments, methods, and materials may be combined in any fashion.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a composition of material, the method comprising:
   providing a population of a semiconducting material and a population of a metal material, wherein the population of semiconducting materials is chosen from the group consisting of: semiconductor powders, semiconducting nanomaterials, and solid semiconductor materials;
   layering the population of the semiconducting material and the population of the metal material, the layering comprising applying the population of the semiconducting material and the population of the metal material adjacent to one another and in alternating layers; and
   consolidating the layered materials using at least one of heat and pressure, wherein the consolidating creates an electrical connection between the at least two alternating layers.

2. The method of claim 1, wherein a single junction is created between the population of the semiconducting material and the population of the metal material.

3. The method of claim 1, wherein a plurality of junctions is created between the population of the semiconducting material and the population of the metal material.

4. The method of claim 1, further comprising adding at least one other material between the population of the semiconducting material and the population of the metal material, the at least one other material being chosen from the group consisting of: a metal, a conductor, an insulator, and a high bandgap semiconducting material.

5. The method of claim 4, wherein the at least one other material is a powder added prior to the consolidating.

6. The method of claim 1, further comprising:
post-processing composition after the consolidating to form a plurality of pillars.

7. A method of forming a composition of material, the method comprising:
providing a population of a semiconducting material and a population of a metal material;
layering the population of the semiconducting material and the population of the metal material, the layering comprising applying the population of semiconducting material and the population of a metal material adjacent to one another and in alternating layers; and
consolidating the layered materials using at least one of heat and pressure, wherein the consolidating creates an electrical connection between the at least two alternating layers, wherein a single junction is created between the at least two alternating layers of the population of semiconducting material and the population of the metal material.

8. A method of forming a composition of material, the method comprising:
providing a population of a semiconducting material and a population of a metal material;
layering the population of the semiconducting material and the population of the metal material, the layering comprising applying the population of semiconducting material and the population of a metal material adjacent to one another and in alternating layers; and
consolidating the layered materials using at least one of heat and pressure, wherein the consolidating creates an electrical connection between the at least two alternating layers, wherein a plurality of junctions is created between the at least two alternating layers of the population of the semiconducting material and the population of the metal material.

* * * * *